United States Patent
Shirahata et al.

(10) Patent No.: US 9,279,182 B2
(45) Date of Patent: Mar. 8, 2016

(54) APPARATUS FOR FORMING METAL OXIDE FILM, METHOD FOR FORMING METAL OXIDE FILM, AND METAL OXIDE FILM

(75) Inventors: Takahiro Shirahata, Tokyo (JP); Hiroyuki Orita, Tokyo (JP); Akio Yoshida, Tokyo (JP); Shizuo Fujita, Kyoto (JP); Toshiyuki Kawaharamura, Kochi (JP)

(73) Assignees: TOSHIBA MITSUBISHI-ELECTRIC INDUSTRIAL SYSTEMS CORPORATION, Tokyo (JP); KYOTO UNIVERSITY, Kyoto-shi (JP)

( * ) Notice: Subject to any disclaimer, the term of this patent is extended or adjusted under 35 U.S.C. 154(b) by 146 days.

(21) Appl. No.: 13/643,380

(22) PCT Filed: Jun. 1, 2010

(86) PCT No.: PCT/JP2010/059243
§ 371 (c)(1),
(2), (4) Date: Oct. 25, 2012

(87) PCT Pub. No.: WO2011/151889
PCT Pub. Date: Dec. 8, 2011

(65) Prior Publication Data
US 2013/0039843 A1 Feb. 14, 2013

(51) Int. Cl.
C23C 16/06 (2006.01)
C23C 16/40 (2006.01)

(52) U.S. Cl.
CPC .................... *C23C 16/407* (2013.01)

(58) Field of Classification Search
None
See application file for complete search history.

(56) References Cited

U.S. PATENT DOCUMENTS

| 2008/0295886 A1* | 12/2008 | Hu et al. ............. 136/256 |
| 2010/0119726 A1 | 5/2010 | Lei et al. |
| 2011/0151619 A1 | 6/2011 | Orita et al. |

FOREIGN PATENT DOCUMENTS

| JP | 2002-146536 A | 5/2002 |
| JP | 2007-109406 A | 4/2007 |
| JP | 2007-144297 A | 6/2007 |
| JP | 2008-182183 A | 8/2008 |
| JP | 2010-103495 A | 5/2010 |
| JP | 2010-111672 A | 5/2010 |
| KR | 10-2005-0019382 | 3/2005 |
| KR | 10-2007-0037492 | 4/2007 |
| WO | WO 2005/124849 A2 | 12/2005 |
| WO | WO 2010/035313 A1 | 4/2010 |

OTHER PUBLICATIONS

Senda, JP2008-0182183, Aug. 2008; Eng Machine translation.*

(Continued)

*Primary Examiner* — Joseph Miller, Jr.
(74) *Attorney, Agent, or Firm* — Oblon, McClelland, Maier & Neustadt, L.L.P.

(57) ABSTRACT

A film forming apparatus includes a first solution container, a second solution container, a reaction chamber, a first path, and a second path. The first solution container stores a source solution containing metal. The second solution container stores hydrogen peroxide. A substrate is in the reaction chamber, and the reaction chamber includes a heating unit that heats the substrate. The first path supplies a source solution from the first solution container to the reaction chamber. The second path supplies hydrogen peroxide from the second solution container to the reaction chamber.

7 Claims, 7 Drawing Sheets

(56) References Cited

OTHER PUBLICATIONS

Kameyana, Japanese App Physics, Sep. 2009 vol. 70 No.1, p. 493—English translation.*

Bao-chen Jiao, et al., "Study of electrical and structural properties of p-type ZnO films along to the growth direction", Journal of Optoelectronics—Laser, vol. 19, No. 4, Apr. 30, 2008, pp. 482-485 (with English abstract).

Xiangdong Gao, et al., "Preparation and Characterization of Highly Oriented ZnO Film by Ultrasonic Assisted SILAR method", Journal of Wuhan University of Technology—Mater.Sci .Ed., vol. 20, No. 3, Sep. 30, 2005, pp. 23-26.

Chinese Search Report issued Dec. 26, 2013 in Chinese Patent Application No. 2010800671843 (with English language translation).

U.S. Appl. No. 13/990,641, filed May 30, 2013, Orita, et al.

International Search Report issued Jun. 29, 2010 in PCT/JP2010/059243 filed Jun. 1, 2010.

International Preliminary Report on Patentability issued Dec. 13, 2012 in PCT/JP2010/059243 filed Jun. 1, 2010.

Written Opinion issued Jun. 29, 2010 in PCT/JP2010/059243 filed Jun. 1, 2010 (with English-language translation).

Naoki Kameyama, et al., "Cho'onpa Funmu Mist CVD-ho ni yoru ZnO Tomei Dodenmaku no Seimaku to Tenkabutsu no Koka", The Japan Society of Applied Physics Gakujyutu Koenkai Koen Yokoshu, vol. 70, No. 1, Sep. 8, 2009, p. 493.

Hiromasa Oda, et al., "Cho'onpa Funmu Mist CVD-ho ni yoru ZnO-kei Hakumaku no Teion Seimaku", The Japan Society of Applied Physics Gakujutsu Koenkai Koen Yokoshu, vol. 70, No. 1, Sep. 8, 2009, p. 493.

* cited by examiner

F I G . 5
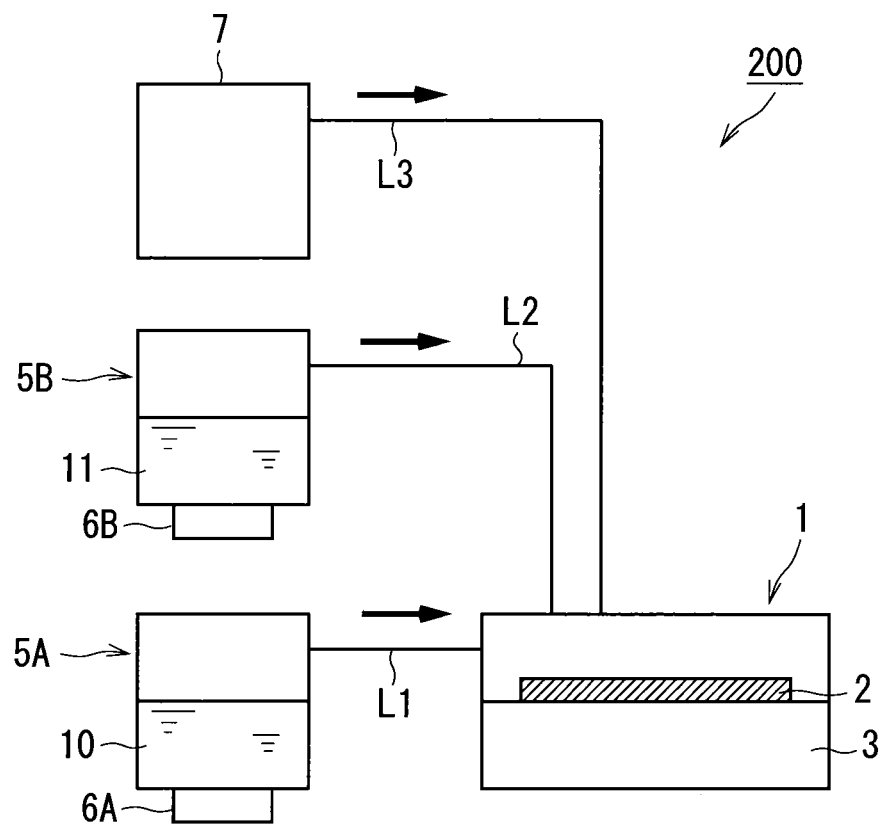

F I G. 1 0
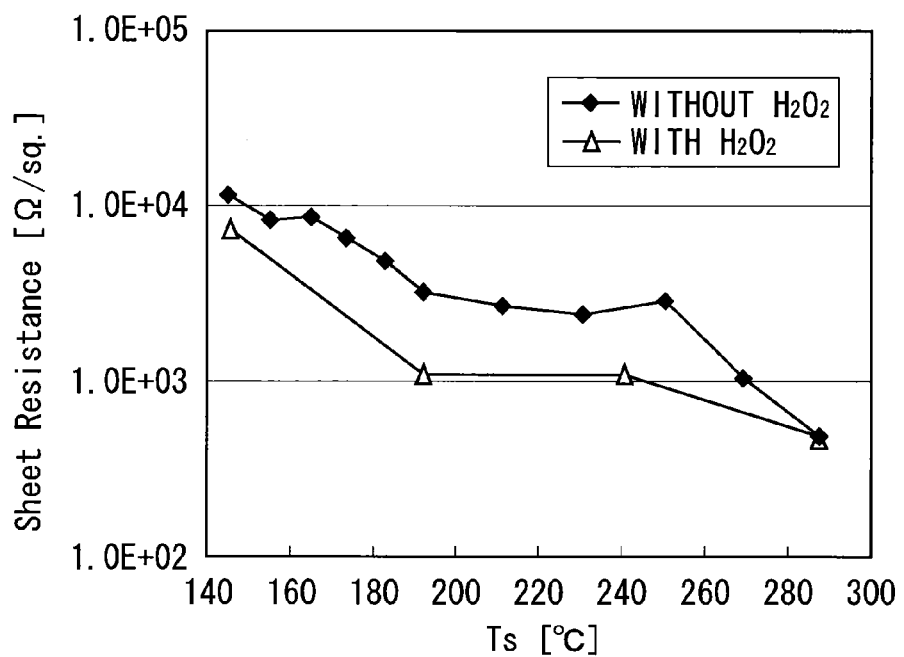
F I G. 1 1
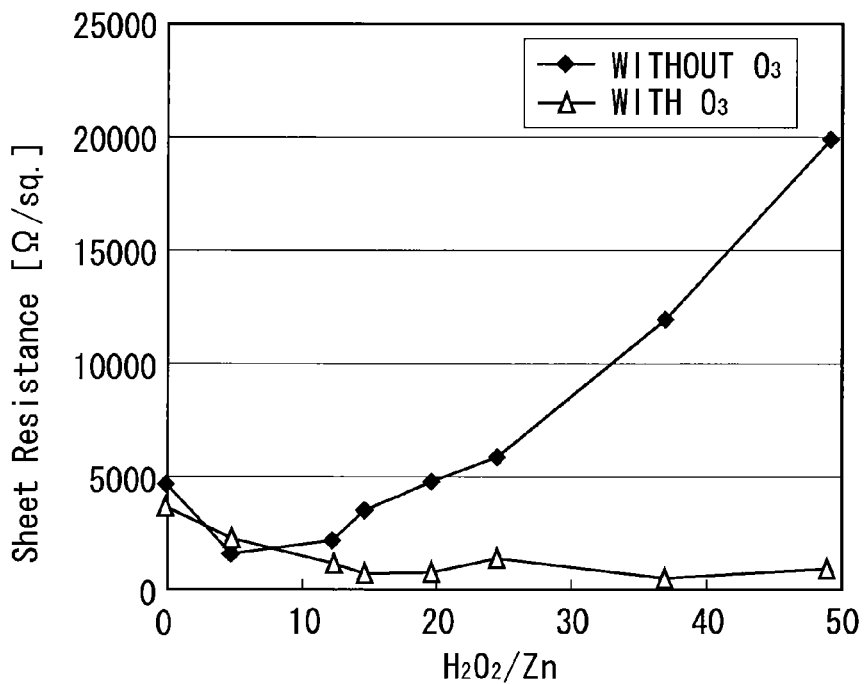

APPARATUS FOR FORMING METAL OXIDE FILM, METHOD FOR FORMING METAL OXIDE FILM, AND METAL OXIDE FILM

TECHNICAL FIELD

The present invention relates to an apparatus for forming a metal oxide film that forms a metal oxide film on a substrate, and a method for forming a metal oxide film. Further, the present invention relates to a metal oxide film formed by the method for forming a metal oxide film.

BACKGROUND ART

In the fields of solar cells, light emitting devices, touch panels, sensors, and the like, metal oxide films are formed on substrates. Conventionally, Patent Documents 1, 2, and 3 disclose the technique of forming a metal oxide film on a substrate.

In the technique of Patent Document 1, a metal oxide film is formed on a substrate by bringing a solution in which a metal salt or a metal complex is dissolved into contact with a heated substrate. In this technique, the solution contains at least one of an oxidizing agent and a reducing agent.

In the technique of Patent Document 2, a tetrabutyltin solution or a tin tetrachloride solution, in which hydrogen peroxide is added as an oxidizing agent, is sprayed onto a preheated substrate and thermally decomposed. Then, after the substrate temperature lowered by spraying of the solution returns, the solution is sprayed repeatedly. Accordingly, a thin film of tin oxide is grown on the surface of the substrate.

In the technique of Patent Document 3, a solution in which a thin film material is dissolved in a volatile solvent is intermittently sprayed toward a substrate kept hot from above to form a transparent conductive film on the surface of the substrate. In this technique, intermittent spraying is high-speed pulsed intermittent spraying in which one spraying duration is 100 milliseconds or less.

PRIOR ART DOCUMENTS

Patent Documents

Patent Document 1: Japanese Patent Application Laid-Open No. 2007-109406
Patent Document 2: Japanese Patent Application Laid-Open No. 2002-146536
Patent Document 3: Japanese Patent Application Laid-Open No. 2007-144297

SUMMARY OF THE INVENTION

Problem to be Solved by the Invention

If a material having high reactivity is selected in forming a meal oxide film on a substrate, the material reacts with oxygen and moisture in the atmosphere and is decomposed. Meanwhile, if a material stable in the atmosphere is selected, as to the temperature for forming a metal oxide film, a substrate needs to be heated at high temperature. Under present circumstances, there is desired a technique of heating a temperature at lower temperature, to thereby form a metal oxide film having low resistance on a substrate.

Therefore, an object of the present invention is to provide an apparatus for forming a metal oxide film that forms a metal oxide film having low resistance through a low temperature treatment, and a method for forming a metal oxide film.

Further, the present invention provides a metal oxide film formed by the method for forming a metal oxide film.

Means to Solve the Problem

In order to solve the above-mentioned problem, an apparatus for forming a metal oxide film according to the present invention includes: a first container storing a source solution containing metal; a second container storing hydrogen peroxide; a reaction chamber in which a substrate is disposed, including a heating unit heating the substrate; a first path connecting the first container and the reaction chamber, for supplying the source solution from the first container to the reaction chamber; and a second path connecting the second container and the reaction chamber, for supplying the hydrogen peroxide from the second container to the reaction chamber.

Further, a method for forming a metal oxide film according to the present invention includes the steps of: (A) forming a source solution containing metal into a mist; (B) heating a substrate; (C) supplying the source solution formed into a mist in the step (A) onto a first main surface of the substrate in the step (B); and (D) supplying hydrogen peroxide through another path different from a supply path for the source solution onto the first main surface of the substrate in the step (B).

Effects of the Invention

In the present invention, a heated substrate is supplied with a source solution containing metal and is also supplied with hydrogen peroxide through a channel different from that for the source solution. This enables to form a metal oxide film having low resistance on a first main surface of a substrate even if the substrate is heated at low temperature.

The object, features, aspects, and advantages of the present invention will be more apparent from the following detailed description in conjunction with the attached drawings.

BRIEF DESCRIPTION OF DRAWINGS

FIG. 5 is a view showing a schematic configuration of an apparatus 200 for forming a metal oxide film according to a fourth embodiment.

FIG. 10 is a figure showing experimental results (sheet resistance–heating temperature) in which the apparatus 150 for forming a metal oxide film was used.

FIG. 11 is a figure showing experimental results (sheet resistance–molar ratio) in which the apparatus 150 for forming a metal oxide film was used.

EMBODIMENTS FOR CARRYING OUT THE INVENTION

Hereinafter, the present invention is specifically described with reference to the drawings showing embodiments thereof.

First Embodiment

Figure 1:
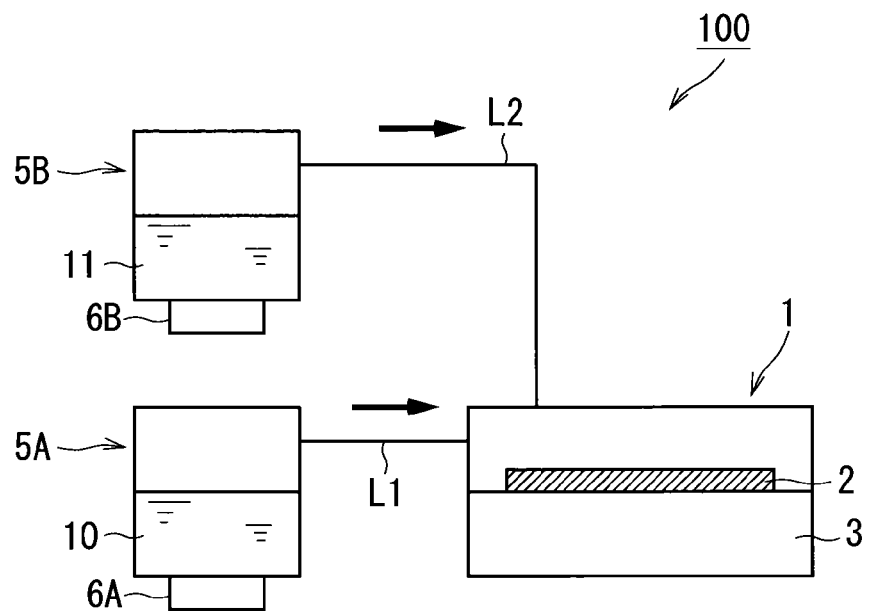
FIG. 1 is a view showing a schematic configuration of an apparatus 100 for forming a metal oxide film according to a first embodiment.

FIG. 1 is a view showing a schematic configuration of an apparatus 100 for forming a metal oxide film according to a first embodiment.

As shown in FIG. 1, the apparatus 100 for forming a metal oxide film according to the first embodiment is configured of a reaction chamber 1, a heating unit 3, a first solution container 5A, a second solution container 5B, a first mist forming unit 6A, a second mist forming unit 6B, a first path L1, and a second path L2.

In the film forming apparatus 100, a spray pyrolysis method, a pyrosol method, a mist deposition method, or the like is performed. That is, in the film forming apparatus 100, a predetermined solution formed into a mist is sprayed onto a first main surface of a substrate 2, so that a predetermined metal oxide film can be formed on the first main surface of the substrate 2.

The substrate 2 being a film-formed body, on which a metal oxide film is formed, is provided in the reaction chamber 1. The heating unit 3 is disposed in the reaction chamber 1, and the substrate 2 is placed on the heating unit 3 (alternatively, the substrate 2 is provided apart from the heating unit 3 in the reaction chamber 1 so as to face the heating unit 3). A metal oxide film is formed on the first main surface of the substrate 2 being heated by the heating unit 3.

As is apparent from this description, the first main surface of the substrate 2 which is referred to in the present specification is the main surface of the substrate 2 on a side on which the metal oxide film is formed. On the other hand, a second main surface of the substrate 2 which is referred to in the present specification is the main surface of the substrate 2 on a side being in contact with the heating unit 3.

During the film forming treatment for a metal oxide film, the reaction chamber 1 is in a non-vacuum (that is, at atmospheric pressure).

A glass substrate, a resin substrate, a film, and the like used in the fields of solar cells, light-emitting devices, touch panels, and flat panel displays such as liquid crystal panels can be employed for the substrate 2.

A heater or the like can be employed for the heating unit 3, which can heat the substrate 2 placed on the heating unit 3 (or facing the heating unit 3). The heating temperature of the heating unit 3 is adjusted by an external controller (not shown) included in the film forming apparatus 100, so that the heating unit 3 is heated to a metal oxide film forming temperature during the film forming treatment.

Stored in the first solution container 5A is a source solution 10 containing metal. The first mist forming unit 6A is provided onto the bottom of the first solution container 5A. For example, an ultrasonic atomizer can be employed for the first mist forming unit 6A. The first mist forming unit 6A can form the source solution 10 in the first solution container 5A into a mist.

While the configuration in which each mist forming unit is disposed on the bottom of each solution container is described herein, the place in which each mist forming unit is provided is not necessarily limited to the bottom of each solution container.

The source solution 10 contains an alkoxide compound, a β-diketone compound, an organic salt compound, an inorganic salt compound, or the like as a metallic element containing compound.

The metal source contained in the source solution 10 may be appropriately selected in accordance with the use of a metal oxide film formed. For example, titanium (Ti), zinc (Zn), indium (In), tin (Sn), or the like can be employed as the metal source.

The source solution 10 is not necessarily required to contain a dopant source. However, it is preferable that the source solution 10 contain at least any one of boron (B), nitrogen (N), fluorine (F), aluminum (Al), phosphorus (P), gallium (Ga), arsenic (As), niobium (Nb), indium (In), antimony (Sb), bismuth (Bi), vanadium (V), and tantalum (Ta) as the dopant source.

Water, alcohols such as ethanol and methanol, and mixed solutions thereof can be employed for the solvent of the source solution 10.

As shown in FIG. 1, the first solution container 5A and the reaction chamber 1 are connected to each other via the first path L1. The source solution 10 formed into a mist by the first mist forming unit 6A is supplied from the first solution container 5A to the reaction chamber 1 through the first path L1. The supplied source solution 10 is splayed onto the first main surface of the substrate 2 disposed being heated in the reaction chamber 1.

Meanwhile, stored in the second solution container 5B is a solution 11 containing hydrogen peroxide. The second mist forming unit 6B is provided onto the bottom of the second solution container 5B. For example, an ultrasonic atomizer can be employed for the second mist forming unit 6B. The second mist forming unit 6B can form the solution 11 in the second solution container 5B into a mist.

Water, alcohols such as ethanol and methanol, and mixed solutions thereof can be employed for the solvent of the solution 11.

The description has been given of the mode in which the source solution 10 in the first solution container 5A contains a predetermined dopant. In place of the source solution 10 containing the dopant, the solution 11 in the second solution container 5B may contain the dopant.

As shown in FIG. 1, the second solution container 5B and the reaction chamber 1 are connected to each other via the second path L2. As is apparent from FIG. 1, the second path L2 is a path provided independently of the first path L1. The solution 11 formed into a mist by the second mist forming unit 6B is supplied from the second solution container 5B to the reaction chamber 1 through the second path L2. The supplied solution 11 is splayed onto the first main surface of the substrate 2 being heated in the reaction chamber 1.

As described above, the first path L1 and the second path L2 are paths independently of each other. Accordingly, the source solution 10 containing metal and the solution 11 containing hydrogen peroxide are supplied to the reaction chamber 1 through different systems. Then, the source solution 10 and the solution 11 are mixed together in the reaction chamber 1.

The source solution 10 and the solution 11 supplied to the reaction chamber 1 react with each other on the substrate 2 being heated, whereby a predetermined metal oxide film is formed on the first main surface of the substrate 2. The metal oxide film formed is a transparent conductive film of indium oxide, zinc oxide, tin oxide, or the like, which depend on the type of the metal source contained in the source solution 10.

The source solution 10 and solution 11 unreacted in the reaction chamber 1 are always (continuously) discharged out of the reaction chamber 1.

Figure 2:
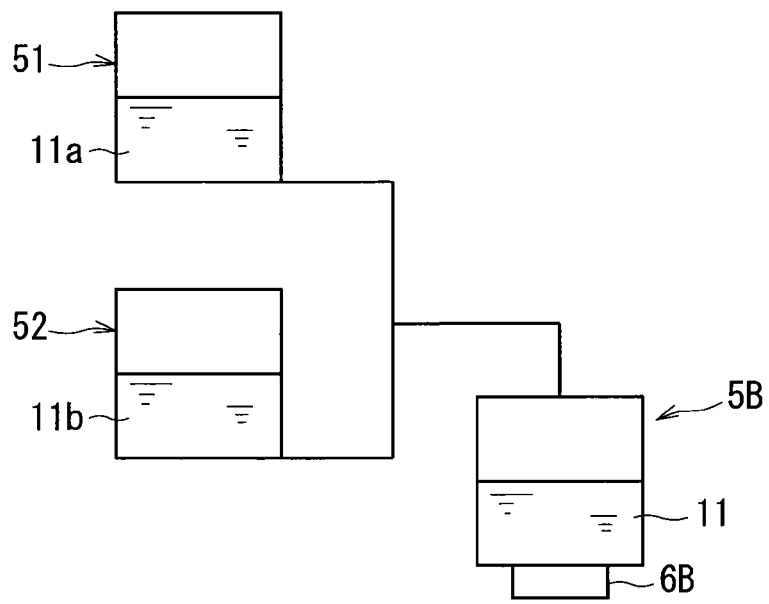
FIG. 2 is a view for describing a method of producing a solution 11 in which an amount of hydrogen peroxide is adjusted.

Further, as shown in FIG. 2, the film forming apparatus 100 includes a container 51 and a container 52 separately. The container 51 stores hydrogen peroxide 11a. Meanwhile, the container 52 stores a component 11b other than the hydrogen peroxide 11a of the solution 11.

The film forming apparatus 100 is externally operated for producing the solution 11. This operation is aimed for adjusting and determining the content of the hydrogen peroxide 11a in the solution 11. The operation is executed on the film forming apparatus 100, so that a predetermined amount of the hydrogen peroxide 11a is delivered from the container 51 and another predetermined amount of the component 11b is delivered from the container 52. Accordingly, the hydrogen peroxide 11a and the component 11b each output are supplied to the second solution container 5B, and the solution 11 containing the hydrogen peroxide 11a of a content determined through the above-mentioned operation is produced in the second solution container 5B.

Next, the method for forming a metal oxide film according to the present embodiment is described.

First, the hydrogen peroxide 11a and the component 11b are mixed together, to thereby produce the solution 11. Here, the source solution 10 containing a predetermined molar amount of zinc as a metal source is prepared in the first solution container 5A.

The film forming apparatus 100 is provided with an input part (not shown) for inputting/selecting the content of hydrogen peroxide in the solution 11. A user performs the operation of inputting or selecting a desired value as the content of hydrogen peroxide on the input part. Then, a first amount of the hydrogen peroxide 11a according to the operation is delivered from the container 51. Meanwhile, a second amount of the component 11b according to the operation is delivered from the container 52. Then, the hydrogen peroxide 11a and the component 11b each delivered are supplied to the second solution container 5B, whereby the solution 11 is produced in the second solution container 5B. Here, the content of hydrogen peroxide in the produced solution 11 is a desired value in the operation.

Figure 3:
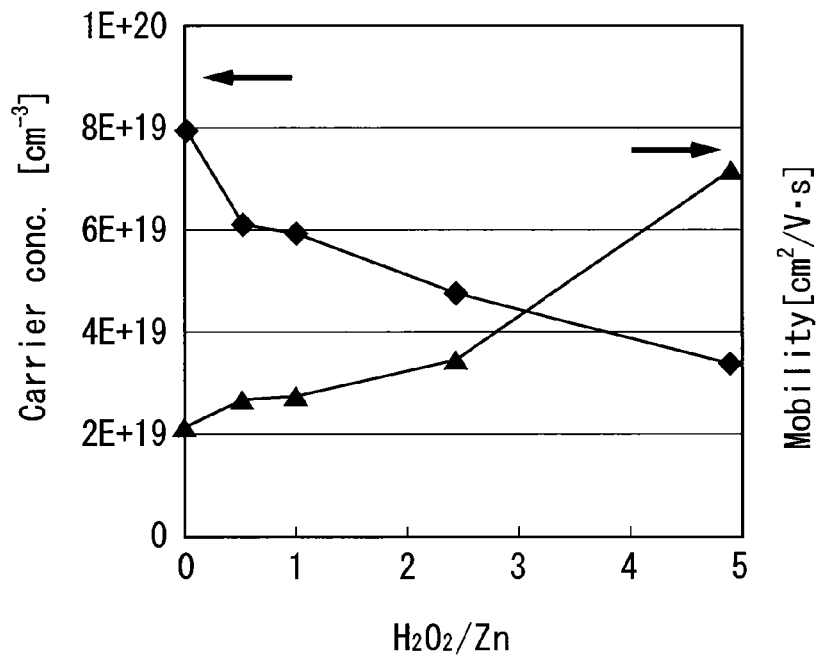
FIG. 3 is a figure showing the relationships among the carrier concentration of a metal oxide film, mobility of the metal oxide film, and molar ratio of $H_2O_2/Zn$.

The inventors have found that the relationships shown in FIG. 3 exist among the molar ratio (=H$_2$O$_2$/Zn) of the content of hydrogen peroxide in the solution 11 (amount of hydrogen peroxide supplied to the reaction chamber 1) to the amount of zinc contained in the source solution 10, the carrier concentration of the metal oxide film formed, and the mobility of the metal oxide film formed.

The vertical axis on the left side in FIG. 3 represents the carrier concentration (cm$^{-3}$) of the metal oxide film formed. The vertical axis on the right side in FIG. 3 represents the mobility (cm$^2$/V·s) of the metal oxide film formed. The horizontal axis in FIG. 3 represents the molar ratio (=H$_2$O$_2$/Zn) of amount of substance of hydrogen peroxide (H$_2$O$_2$) to amount of substance of zinc (Zn). "Square marks" in FIG. 3 indicate data values showing the relationship between the molar ratio and the carrier concentration. "Triangular marks" in FIG. 3 indicate data values showing the relationship between the molar ratio and the mobility.

FIG. 3 reveals that the carrier concentration of the metal oxide film formed decreases along with an increase of the content of hydrogen peroxide in the solution 11 to the content of zinc in the source solution 10. Further, FIG. 3 reveals that the mobility of the metal oxide film formed increases along with an increase of the content of hydrogen peroxide in the solution 11 to the content of zinc in the source solution 10.

As is well known, the resistivity of a metal oxide film formed is proportional to the inverse of carrier concentration× mobility.

Therefore, data shown in FIG. 3 is prepared in advance prior to the production of the solution 11. Then, the user considers that the physical properties (such as transmittance) of the metal oxide film are changed by changing the resistivity, mobility and carrier concentration of a metal oxide film formed. In the case of the operation of selecting/inputting the content of hydrogen peroxide, the user takes the above into consideration and then determines the content of hydrogen peroxide in the solution 11 in accordance with the use of the metal oxide film formed, using the data shown in FIG. 3. In other words, the user determines the amount of hydrogen peroxide supplied to the reaction chamber 1 using the data shown in FIG. 3.

The source solution 10 is prepared in the first container 5A, and the solution 11 is prepared in the second container 5B, so that the source solution 10 is formed into a mist by the first mist forming unit 6A in the first solution container 5A, and the solution 11 is formed into a mist by the second mist forming unit 6B in the second solution container 5B.

The source solution 10 formed into a mist is supplied to the reaction chamber 1 through the first path L1. Meanwhile, the solution 11 formed into a mist is supplied to the reaction chamber 1 through the second path L2 that is a path different from the first path L1.

Meanwhile, the substrate 2 being in contact with the heating unit 3 is heated to a metal oxide film forming temperature by the heating unit 3, and the temperature of the substrate 2 is maintained at the metal oxide film forming temperature. For example, the temperature of the substrate 2 is maintained at 300° C. or lower.

The source solution 10 formed into a mist and the solution 11 formed into a mist are supplied to the first main surface of the substrate 2 being heated as descried above. Accordingly, a predetermined metal oxide film is formed on the first main surface of the substrate 2 located in the reaction chamber 1.

As described above, in the present embodiment, the source solution 10 containing metal and the solution 11 containing hydrogen peroxide are supplied to the reaction chamber 1 through different paths. Then, the source solution 10 and the hydrogen peroxide (solution 11) are brought into contact with the substrate 2 being heated in the reaction chamber 1.

Therefore, a metal oxide film having low resistivity can be formed on the first main surface of the substrate 2 even if the heating temperature of the substrate 2 is low. This effect is described in a fifth embodiment below with reference to experimental data.

In the present embodiment, the data shown in FIG. 3 is prepared in advance, and the amount of hydrogen peroxide to the amount of zinc contained in the source solution 10, which is supplied to the reaction chamber 1, is determined by using the data.

Therefore, the carrier concentration and mobility of a metal oxide film formed can be adjusted, whereby it is possible to provide a metal oxide film having physical property values according to the use.

As described above, the source solution 10 or the solution 11 may contain a dopant. Depending on the conductivity type of a dopant, a metal oxide film (transparent conductive film) being an n-type semiconductor can enter an electron-richer state. In this case, the electric resistance of a metal oxide film (transparent conductive film) formed can be lowered more. Further, it is conceivable that a metal oxide film may be a p-type semiconductor depending on the conductivity type of the dopant. In the metal oxide film being a p-type semiconductor, a hole serves as a carrier to become conductive, which increases the usefulness thereof as a light-emitting device rather than as a transparent conductive film.

Second Embodiment

In a second embodiment, the source solution 10 described in the first embodiment further contains ammonia or ethylenediamine.

That is, in the film forming apparatus 100 shown in FIG. 1, the first solution container 5A stores the source solution 10 further containing a predetermined amount of ammonia or a predetermined amount of ethylenediamine.

Then, the first mist forming unit 6A forms the source solution 10 further containing ammonia or ethylenediamine into a mist. Then, the source solution 10 formed into a mist is supplied to the reaction chamber 1 through the first path L1. As described also in the first embodiment, in this case, the substrate 2 is heated to a metal oxide film forming temperature in the reaction chamber 1.

The configuration of the film forming apparatus 100 and the operation in the film forming method other than the above are similar to those described in the first embodiment.

As described above, in the present embodiment, the source solution 10 containing ammonia (or ethylenediamine) in addition to metal is formed into a mist. Then, in the reaction chamber 1, the source solution 10 formed into a mist is brought into contact with the heated substrate 2.

Accordingly, it is possible to further improve the production efficiency of the metal oxide while maintaining low resistance of a metal oxide film formed. That is, the source solution 10 further contains ammonia (or ethylenediamine), leading to improvement of the film forming rate of a metal oxide film. Through the improvement of the film forming rate, it is possible to form a metal oxide film having a predetermined film thickness in a short time.

Third Embodiment

Figure 4:
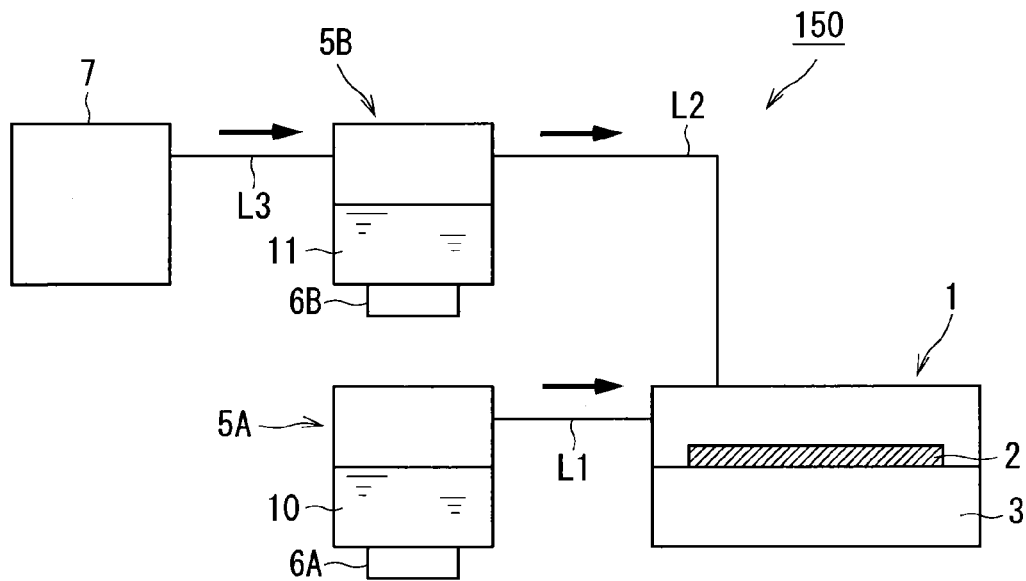
FIG. 4 is a view showing a schematic configuration of an apparatus 150 for forming a metal oxide film according to a third embodiment.

FIG. 4 is a view showing a schematic configuration of an apparatus 150 for forming a metal oxide film according to a third embodiment.

As is apparent from the comparison between FIGS. 1 and 4, the apparatus 150 for forming a metal oxide film according to the present embodiment has a configuration in which an ozone generator 7 is added to the configuration of the apparatus 100 for forming a metal oxide film according to the first embodiment. In addition, a third path L3 is disposed in a film forming apparatus 150 for supplying ozone from the ozone generator 7 to the second solution container 5B.

The other configuration is similar to the descriptions above in the first and second embodiments except that the ozone generator 7 and the third path L3 are additionally provided.

The ozone generator 7 can generate ozone. The ozone generated in the ozone generator 7 is supplied to the second solution container 5B through the third path L3. Then, the supplied ozone is supplied toward the first main surface of the substrate 2 in the reaction chamber 1 through the second path L2, together with the solution 11 containing hydrogen peroxide.

In the ozone generator 7, for example, an oxygen molecule is decomposed by applying high voltage between parallel electrodes disposed in parallel and passing oxygen between the electrodes, and the oxygen molecule couples with another oxygen molecule, so that ozone is generated.

When ozone, the misty solution 11, and the misty source solution 10 are supplied to the reaction chamber 1, the ozone, the solution 11, and the source solution 10 react with each other on the substrate 2 being heated, whereby a predetermined metal oxide film is formed on the first main surface of the substrate 2. The ozone, solution 11, and source solution 10 unreacted in the reaction chamber 1 are always (continuously) discharged out of the reaction chamber 1.

Next, a method for forming a metal oxide film according to the present embodiment is described.

First, as described in the first embodiment (see FIGS. 2 and 3), the amount of hydrogen to the content of a metal source contained in the source solution 10, which is supplied to the reaction chamber 1, is determined. Then, the solution 11 containing hydrogen peroxide is produced in the second solution container 5B based on the determined amount.

The source solution 10 and the solution 11 are prepared in the first solution container 5A and the second solution container 5B, respectively, and then, ozone is generated in the ozone generator 7. In the first solution container 5A, the first mist forming unit 6A forms the source solution 10 into a mist. In the second solution container 5B, the second mist forming unit 6B forms the solution 11 into a mist.

The generated ozone is supplied to the second solution container 5B through the third path L3. Then, the ozone and the misty solution 11 are supplied to the reaction chamber 1 through the second path L2. The misty source solution 10 is supplied to the reaction chamber 1 through the first path L1. As described in the first embodiment, the second path L2 through which hydrogen peroxide passes is different from the first path L1 through which the source solution 10 containing metal passes.

Meanwhile, the substrate 2 being in contact with the heating unit 3 is heated to a metal oxide film forming temperature by the heating unit 3, and the temperature of the substrate 2 is maintained at the metal oxide film forming temperature. For example, the temperature of the substrate 2 is maintained at approximately 200° C.

The ozone, the source solution 10 containing metal, and the solution 11 containing hydrogen peroxide are supplied to the first main surface of the substrate 2 being heated. The contact of the ozone and the solutions 10 and 11 with the substrate 2 being heated causes thermal decomposition of the ozone, which produces an oxygen radical. The oxygen radical accelerates the decomposition of the source solution 10, so that a predetermined metal oxide film is formed on the first main surface of the substrate 2.

As described above, the ozone generator 7 that generates ozone to be supplied to the reaction chamber 1 is also provided in the present embodiment.

Therefore, ozone and active oxygen produced as a result of the decomposition of ozone due to heat or the like are highly reactive, and accordingly, the decomposition and oxidation of material compound in the source solution 10 are accelerated. This enables to form a metal oxide film having low resistance on the substrate 2 even in a state in which a heating temperature is lower compared with the first embodiment.

Also in the present embodiment, the source solution 10 may contain ammonia or ethylenediamine as described in the second embodiment. Alternatively, the source solution 10 or the solution 11 may contain a dopant as described in the first embodiment. The metal contained in the source solution 10 is appropriately selected depending on the type of a metal oxide film to be formed. Still alternatively, the amount of hydrogen peroxide to the amount of zinc contained in the solution 10, which is supplied to the reaction chamber 1, may be determined in accordance with the use of a metal oxide film (zinc oxide film) to be formed, as described with reference to FIGS. 2 and 3.

Fourth Embodiment

Figure 6:
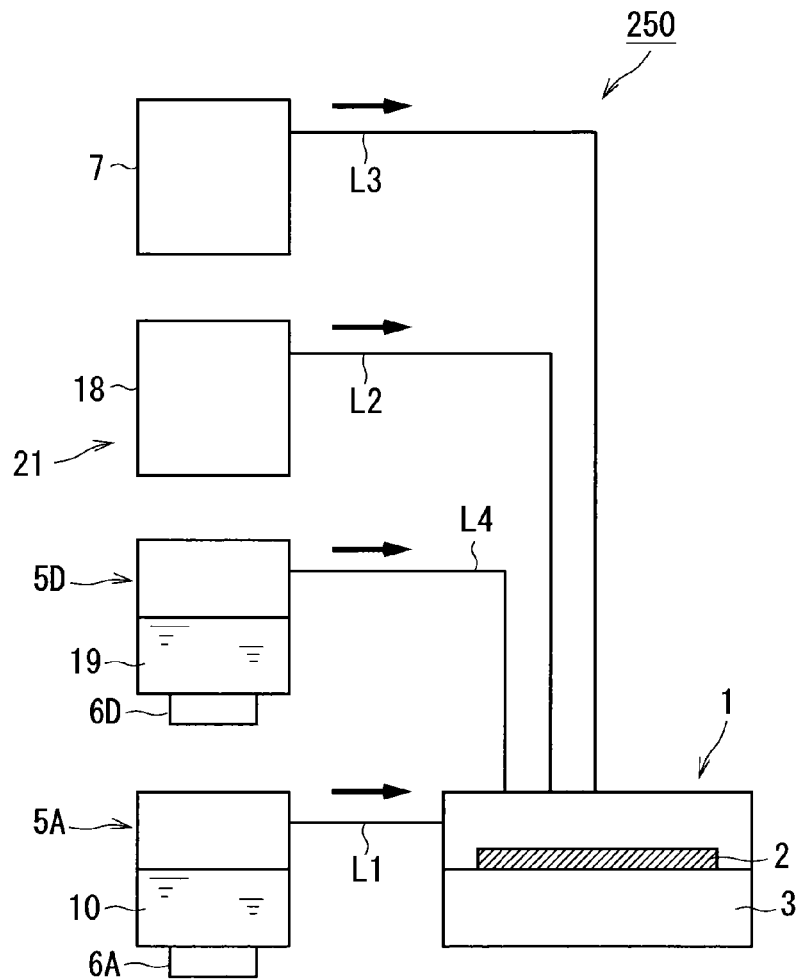
FIG. 6 is a view showing a schematic configuration of an apparatus 250 for forming a metal oxide film according to the fourth embodiment.

The present embodiment describes modifications of the third embodiment. FIGS. 5 and 6 show the modifications of the film forming apparatus including the ozone generator 7 described in the third embodiment.

In the apparatus 200 for forming a metal oxide film shown in FIG. 5, the ozone generator 7 is connected to the reaction chamber 1 by means of the third path L3. The ozone generated in the ozone generator 7 is supplied to the reaction chamber 1 through the third path L3. As is apparent from the comparison between FIGS. 4 and 5, in the film forming apparatus 200, the ozone passes through the third path L3 provided independently of the first and second paths L1 and L2.

Therefore, the source solution 10 containing metal, the solution 11 containing hydrogen peroxide, and the ozone are supplied to the reaction chamber 1 in which the substrate 2 being heated is disposed through the first path L1, the second path L2, and the third path L3, respectively.

The other configuration and operation of the film forming apparatus 200 are similar to the description in the third embodiment.

In an apparatus 250 for forming a metal oxide film shown in FIG. 6, the ozone generator 7 is connected to the reaction chamber 1 by means of the third path L3. The ozone generated in the ozone generator 7 is supplied to the reaction chamber 1 through the third path L3. Further, a container 21 is provided. The container 21 stores a gas 18 containing hydrogen peroxide of a predetermined concentration. The second path L2 connecting the container 21 to the reaction chamber 1 is provided. The gas 18 in the container 21 is supplied to the reaction chamber 1 through the second path L2. The film forming apparatus 250 is further provided with another solution container 5D that stores a solution 19 containing a dopant. The another solution container 5D is connected to the reaction chamber 1 by means of another path L4. The solution 19 in the another solution container 5D that is formed into a mist by another mist forming unit 6D is supplied to the reaction chamber 1 through the another path L4.

That is, as is apparent from the comparison between FIGS. 4 and 6, the film forming apparatus 250 is different from the film forming apparatus 150 in the following points.

In the film forming apparatus 250, ozone passes through the third path L3 provided independently of the paths L1, L2, and L4. In place of preparing liquid hydrogen peroxide and supplying the misty hydrogen peroxide to the reaction chamber 1, in the film forming apparatus 250, gaseous hydrogen peroxide is prepared (see container 21 and gas 18), and the hydrogen peroxide is supplied to the reaction chamber 1 as the gas. The film forming apparatus 250 is also provided with the second path L2 for supplying gaseous hydrogen peroxide independently of the first path L1 through which the source solution 10 is supplied.

The film forming apparatus 250 is provided with the another solution container 5D that stores the solution 19 containing a dopant and the another path L4 for transferring the solution 19. That is, the another solution container 5D and the another path L4 are elements dedicated to a dopant.

Therefore, in a case where the supply of a dopant to the reaction chamber 1 is omitted, the film forming apparatus 250 may not be provided with the elements including the another solution container 5D and the another path L4. Also in a case where the supply of a dopant to the reaction chamber 1 is not omitted, if the source solution 10 contains a dopant as well, the film forming apparatus 250 may not be provided with the elements including the another solution container 5D and the another path L4.

In the film forming apparatus 250, the source solution 10 containing metal, the gas 18 containing hydrogen peroxide, and the ozone are supplied to the reaction chamber 1 in which the substrate 2 being heated is disposed through the first path L1, the second path L2, and the third path L3, respectively, and the solution 19 containing a dopant is supplied thereto through the another path L4.

The other configuration and operation of the film forming apparatus 250 are similar to the description in the third embodiment.

Fifth Embodiment

The present embodiment describes the experimental data showing the effects of the present invention.

Comparative Example

Figure 7:
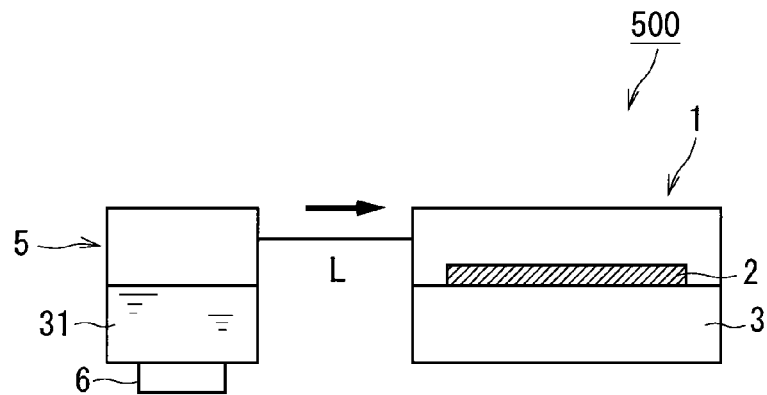
FIG. 7 is a view showing a schematic configuration of an apparatus 500 for forming a metal oxide film, which causes a source solution to contain hydrogen peroxide and a metal source and supplies the source solution to a substrate.

First, the experimental results in a case of using a film forming apparatus 500 shown in FIG. 7 are described before describing the effects of the present invention.

In the film forming apparatus 500 shown in FIG. 7, a solution container 5 stores a source solution 31. The source solution 31 contains not only metal but also hydrogen peroxide. The source solution 31 formed into a mist by a mist forming unit 6 is supplied to the reaction chamber 1 through one path L. That is, in the film forming apparatus 500, hydrogen peroxide and a metal source of a film to be formed are supplied to the reaction chamber 1 through the same system.

Figure 8:
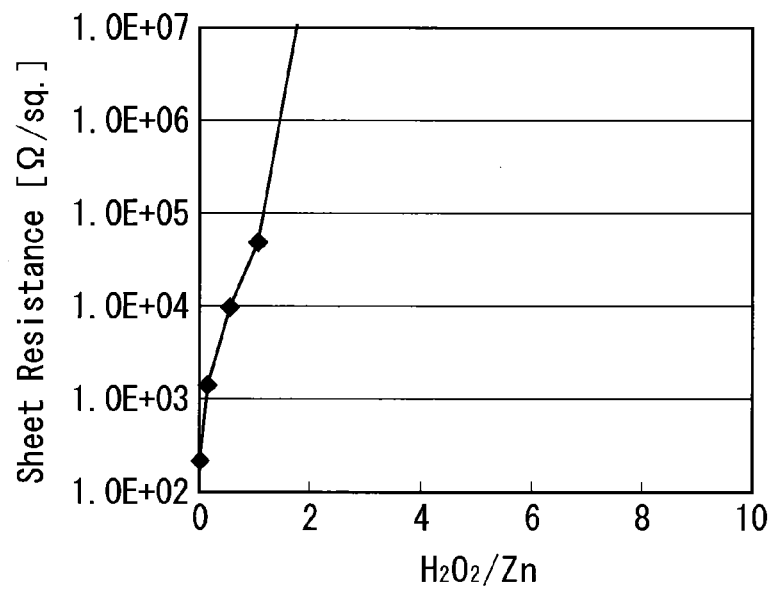
FIG. 8 is a figure showing experimental results (sheet resistance–molar ratio) in which the apparatus 500 for forming a metal oxide film was used.
Figure 9:
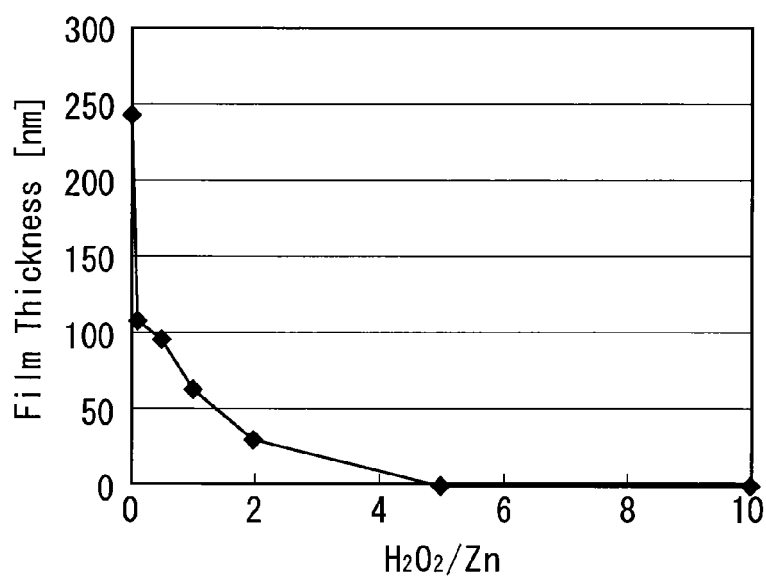
FIG. 9 is a figure showing experimental results (film thickness–molar ratio) in which the apparatus 500 for forming a metal oxide film was used.

The experiment of forming a zinc oxide film on the first main surface of the substrate 2 was conducted using the film forming apparatus 500. FIGS. 8 and 9 show the experimental results.

In the experiment, the source solution 31 in which $ZnAcac_2$ (zinc acetylacetonate)=0.02 mol/L and MeOH (methanol)/$H_2O$ (water)=9 was used, and the heating temperature of the substrate 2 was set to approximately 300° C. Further, the source solution 31 contained hydrogen peroxide, and the content of the hydrogen peroxide was varied in the range where $H_2O_2$ (hydrogen peroxide)/Zn (zinc)=0 to 10 (specifically, the content of zinc was constant, where $H_2O_2$/Zn=0, 0.1, 0.5, 1, 2, 5, 10).

FIG. 8 shows the results of the measurement of the sheet resistance of each zinc oxide film formed on the substrate 2 by varying the content of hydrogen peroxide in the source solution 31. In FIG. 8, the vertical axis represents a sheet resistance ($\Omega$/sq.) and the horizontal axis represents $H_2O_2$/Zn (molar ratio).

As shown in FIG. 8, in the case of using the film forming apparatus 500, the sheet resistance of a zinc oxide film formed sharply increases along with an increase of the content of hydrogen peroxide in the source solution 31. In the measurement where $H_2O_2/Zn=2$, the sheet resistance of a zinc oxide film formed exceeded the range of the vertical axis in FIG. 8 (as described below, a zinc oxide film is not formed if $H_2O_2/Zn=5$ or larger.

That is, as is apparent from the results of FIG. 8, in a case of using the film forming apparatus 500 supplying hydrogen peroxide and metal through the same system, a zinc oxide film having low resistance could not be formed, but a zinc oxide film having considerably high resistance was formed.

FIG. 9 shows the results of the measurement of the film thickness of each zinc oxide film formed on the substrate 2 by varying the content of hydrogen peroxide in the source solution 31. In FIG. 9, the vertical axis represents a film thickness (nm) and the horizontal axis represents $H_2O_2/Zn$ (molar ratio). Also in FIG. 9, the content of zinc was constant, whereas the content of hydrogen peroxide was varied.

As shown in FIG. 9, in the case of using the film forming apparatus 500, the film thickness of a zinc oxide film formed decreases along with an increase of the content of hydrogen peroxide in the source solution 31. In the measurements where $H_2O_2/Zn=5$ or larger, a zinc oxide film was not formed on the substrate 2.

<Experimental Result 1>

FIG. 10 is a figure showing the experimental results using the film forming apparatus 150 described in the third embodiment (see FIG. 4).

In "Experimental result 1", the source solution 10 contains not only a metal source but also ammonia, a dopant, and the like. Specific film forming conditions in "Experimental result 1" are as follows.

That is, the source solution 10 in which $ZnAcac2=0.02$ mol/L, $GaAcac3=0.03$ mol/L, $NH_3$ (ammonia solution) 28%=3 mL (in 100 mL of solution), and $MeOH/H_2O=9$ was used. Further, the solution 11 containing hydrogen peroxide of an amount that satisfies $H_2O_2/Zn$ (content of zinc in the source solution 10)=25 in which $MeOH/H_2O=9$ was used. The flow rate of ozone supplied to the reaction chamber 1 was 10 mg/min. Moreover, the heating temperature of the substrate 2 was varied from 145° C. to 287° C.

FIG. 10 shows the results of the measurement of the sheet resistance of each zinc oxide film formed on the substrate 2 by varying the film forming temperature for the substrate 2. In FIG. 10, the vertical axis represents a sheet resistance ($\Omega$/sq.) and the horizontal axis represents the temperature (° C.).

FIG. 10 also shows the results obtained by employing the film forming conditions described above except that hydrogen peroxide was not supplied (omitting the container 5B in FIG. 4). Specifically, in FIG. 10, white triangular marks indicate the experimental result data in the case where the hydrogen peroxide was supplied, whereas black diamond marks indicate the experimental result data in the case where the hydrogen peroxide was not supplied.

As shown in FIG. 10, at the film forming temperatures except for 287° C. at which the substrate 2 was heated, the sheet resistance of a metal oxide film formed reduced more in the case where hydrogen peroxide was supplied. Further, in the case where hydrogen peroxide was supplied, a metal oxide film having sufficiently low resistance could be produced even at a low film forming temperature (approximately 200° C.).

<Experimental Result 2>

FIG. 11 is a figure showing the experimental results using the film forming apparatus 150 described in the third embodiment (see FIG. 4).

In "Experimental result 2", the source solution 10 contains not only a metal source but also ammonia, a dopant, and the like. Specific film forming conditions in "Experimental result 2" are as follows.

That is, the source solution 10 in which $ZnAcac2=0.04$ mol/L, $GaAcac3=0.06$ mol/L, $NH_3$ (ammonia solution) 28%=3 mL (in 100 mL of solution), and $MeOH/H_2O=9$ was used. Further, the solution 11 containing hydrogen peroxide of an amount that satisfies $H_2O_2/Zn$ (the content of zinc in the source solution 10)=0 to 49 where $MeOH/H_2O=9$ was used. Specifically, the content of hydrogen peroxide in the solution 11 was varied so as to satisfy $H_2O_2/Zn=0, 5, 12, 15, 20, 24, 37$ and 49 (content of zinc was constant). The flow rate of ozone supplied to the reaction chamber 1 was 10 mg/min. Moreover, the heating temperature of the substrate 2 was approximately 200° C.

FIG. 11 shows the results of the measurement of the sheet resistance of each zinc oxide film formed on the substrate 2 by varying the content of hydrogen peroxide in the solution 11. In FIG. 11, the vertical axis represents a sheet resistance ($\Omega$/sq.) and the horizontal axis represents $H_2O_2/Zn$ (molar ratio).

FIG. 11 shows the measurement results in both cases where ozone was supplied to the reaction chamber 1 and where ozone was not supplied to the reaction chamber 1 (the film forming conditions were the same in both cases except for the presence/absence of the ozone supply). In FIG. 11, white triangular marks indicate the experimental result data in the case where ozone was supplied, whereas black diamond marks indicate the experimental result data in the case where ozone was not supplied.

As shown in FIG. 11, in the case where ozone was supplied, a metal oxide film having sufficiently low resistance could be formed at the low film forming temperature (approximately 200° C.). In the case where ozone was supplied, the resistance of a metal oxide film formed tends to decrease along with an increase of the amount of hydrogen peroxide in the area where $H_2O_2/Zn$ does not exceed 12. Meanwhile, in the area where $H_2O_2/Zn$ is 12 or larger, the resistance of a metal oxide film formed is approximately constant even if the amount of hydrogen peroxide is increased.

As shown in FIG. 11, even in a case where ozone was not supplied, as is apparent from the comparison with FIG. 8, the sheet resistance of a metal oxide film formed maintains a sufficiently low resistance even when the amount of hydrogen peroxide was increased.

As shown in FIG. 11, in a case where ozone was not supplied, a zinc oxide film having a sheet resistance equal to or smaller than the sheet resistance of a zinc oxide film formed in the case where hydrogen peroxide was not contained (case where the vertical axis in FIG. 11 is zero) could be formed in the area in which $H_2O_2/Zn$ is 20 or smaller.

<Experimental Result 3>

Figure 12:
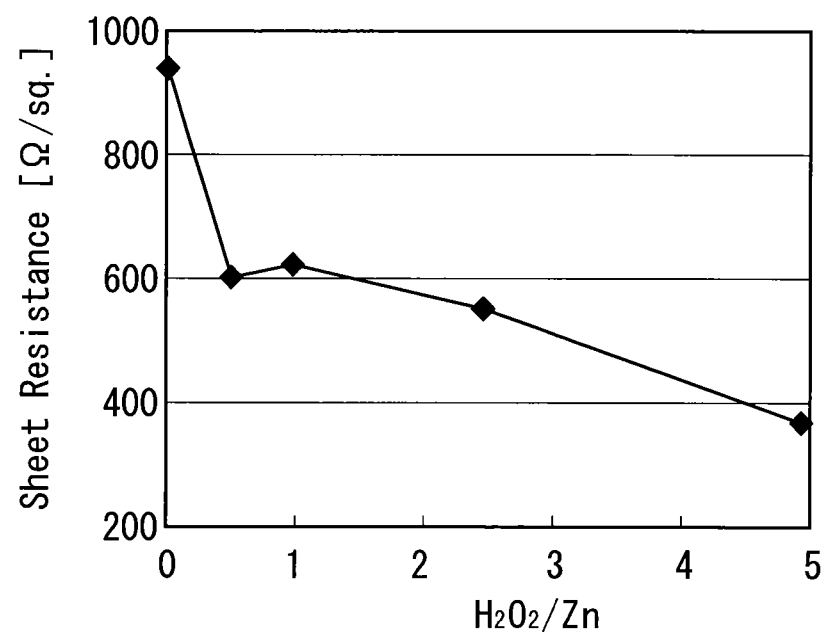
FIG. 12 is another figure showing experimental results (sheet resistance–molar ratio) in which the apparatus 150 for forming a metal oxide film was used.

FIG. 12 is a figure showing the experimental results using the film forming apparatus 150 described in the third embodiment (see FIG. 4).

In "Experimental result 1" and "Experimental results 2", a dopant of a predetermined conductivity type was contained in the source solution 10. On the other hand, in "Experimental result 3", the solution 11 containing hydrogen peroxide contains a dopant of a predetermined conductivity type. Specific film forming conditions in "Experimental result 3" are as follows.

That is, the source solution 10 in which $ZnAcac2=0.04$ mol/L, $NH_3$ (ammonia solution) 28%=3 mL (in 100 mL of solution), and $MeOH/H_2O=9$ was used. Further, the solution 11 containing gallium of an amount that satisfies GaAcac3=0.0008 mol/L and containing hydrogen peroxide of an amount that satisfies $H_2O_2/Zn$ (the content of zinc in the source solution 10)=0 to 4.9 where $MeOH/H_2O$=9 was used. Specifically, the content of hydrogen peroxide in the solution 11 was varied so as to satisfy $H_2O_2/Zn$=0, 0.5, 1, 2.5, and 4.9 (the content of zinc was constant). The flow rate of ozone supplied to the reaction chamber 1 was 10 mg/min. Moreover, the heating temperature of the substrate 2 was approximately 200° C.

FIG. 12 shows the results of the measurement of the sheet resistance of each zinc oxide film formed on the substrate 2 by varying the content of hydrogen peroxide in the solution 11. In FIG. 12, the vertical axis represents a sheet resistance (Ω/sq.) and the horizontal axis represents $H_2O_2/Zn$ (molar ratio).

As shown in FIG. 12, a metal oxide film having sufficiently low resistance could be formed at a low film forming temperature (approximately 200° C.). Further, similarly to the tendency shown in FIG. 11, the resistance of a metal oxide film formed decreases along with an increase of the amount of hydrogen peroxide.

In the experimental results shown in FIG. 11, if $H_2O_2/Zn$=5, the sheet resistance of a metal oxide film formed was 2200 (Ω/sq.) in a case where ozone was supplied. In "Experimental result 2" where the results of FIG. 11 were obtained, the source solution 10 contained a dopant of a predetermined conductivity type.

On the other hand, as shown in FIG. 12, the sheet resistance of a metal oxide film formed was 630 (Ω/sq.) or lower in "Experimental Result 3" in which the solution 11 contained a dopant of a predetermined conductivity type. That is, the sheet resistance of a metal oxide film formed becomes smaller in the case where the solution 11 contains a dopant compared with the case where the source solution 10 contains a dopant.

On both of the film forming conditions for "Experimental result 2" and the film forming conditions for "Experimental result 3", $ZnAcac_2$=0.04 mol/L. On the other hand, Ga/Zn=0.15 on the film forming conditions for "Experimental result 2", whereas Ga/Zn=0.02 on the film forming conditions for "Experimental result 3". That is, it is understood that the sheet resistance of a metal oxide film formed became smaller in "Experimental result 3" compared with "Experimental result 2" although the amount of a dopant decreased more in "Experimental result 3" compared with "Experimental Result 2".

While the present invention has been described above in detail, the foregoing description is in all aspects illustrative, and the present invention is not limited thereto. That is, numerous modifications and variations can be devised in the described aspects without departing from the scope of the invention.

DESCRIPTION OF REFERENCE SYMBOLS

1 reaction chamber
2 substrate
3 heating unit
5A first solution container
5B second solution container
5D another solution container
6A first misting unit
6B second misting unit
6D another misting unit
7 ozone generator
10 source solution
11 solution
18 gas (containing hydrogen peroxide)
19 solution (containing dopant)
21 container
L1 first path
L2 second path
L3 third path
L4 another path
100, 150, 200, 250 apparatus for forming metal oxide film

The invention claimed is:

1. A method for forming a metal oxide film, the method comprising:
forming a source solution comprising metal into a mist;
heating a substrate;
supplying the source solution formed into a mist onto a first main surface of the substrate through a first supply path;
supplying ozone onto the first main surface of the substrate; and
supplying hydrogen peroxide through a second path different from the first supply path onto the first main surface of the substrate,
wherein the method further comprises, in the following order:
preliminarily preparing data showing a relationship among a molar ratio of an amount of the hydrogen peroxide to an amount of the zinc in the source solution, a carrier concentration of the metal oxide film, and a mobility of the metal oxide film;
determining an amount of the hydrogen peroxide supplied with the data, and
supplying the determined amount of the hydrogen peroxide through the second path onto the first main surface of the substrate,
wherein
the substrate is arranged under atmospheric pressure,
the source solution is converted into a mist by an ultrasonic atomizer,
the metal is zinc, and
wherein the heating is performed at a temperature of 190 to 240° C.

2. The method of claim 1, wherein the source solution further comprises ammonia.

3. The method of claim 1, wherein the source solution further comprises ethylenediamine.

4. The method of claim 1, wherein the molar ratio of the amount of the hydrogen peroxide to the amount of the zinc in the source solution is 20 or smaller.

5. The method of claim 1, wherein supplying the hydrogen peroxide further comprises supplying a dopant of a predetermined conductivity type onto the first main surface of the substrate with the hydrogen peroxide through the second path.

6. The method of claim 1, wherein the source solution comprises boron, nitrogen, fluorine, aluminum, phosphorus, gallium, arsenic, niobium, indium, antimony, bismuth, vanadium, tantalum, or any combination thereof.

7. The method of claim 1, wherein the source solution comprises water, an alcohol, or a mixed solution thereof.

* * * * *